United States Patent

Kawasaki

[11] Patent Number: 5,372,666
[45] Date of Patent: Dec. 13, 1994

[54] METHOD OF MANUFACTURING A MULTILAYERED CIRCUIT BOARD

[75] Inventor: Sadanobu Kawasaki, Kawasaki, Japan

[73] Assignee: E. I. Du Pont de Nemours and Company, Wilmington, Del.

[21] Appl. No.: 222,503

[22] PCT Filed: Oct. 25, 1990

[86] PCT No.: PCT/US90/06160
§ 371 Date: Apr. 24, 1992
§ 102(e) Date: Apr. 24, 1992

[87] PCT Pub. No.: WO91/07073
PCT Pub. Date: May 16, 1991

Related U.S. Application Data

[63] Continuation of Ser. No. 849,072, Apr. 24, 1992, abandoned.

[30] Foreign Application Priority Data

Oct. 25, 1989 [JP] Japan .................. 1-278292

[51] Int. Cl.$^5$ .................. B32B 31/00
[52] U.S. Cl. .................. 156/89; 156/231; 156/235; 264/58; 264/61
[58] Field of Search .................. 156/89, 230, 231, 235, 156/237; 264/58, 61, 63

[56] References Cited

U.S. PATENT DOCUMENTS

| | | | |
|---|---|---|---|
| 4,655,864 | 4/1987 | Rellick | 156/89 |
| 4,789,770 | 12/1988 | Kasner et al. | 219/121.71 X |
| 4,806,188 | 2/1989 | Rellick | 156/89 |
| 4,929,295 | 5/1990 | Kohno et al. | 156/89 X |

*Primary Examiner*—David A. Simmons
*Assistant Examiner*—James J. Engel

[57] ABSTRACT

A method of manufacturing a multilayered circuit board, comprises the steps of: (a) laminating an insulating sheet on a lower layer (2) which reflects a laser light applied through the insulating sheet (4 and 6), said insulating sheet comprising a carrier film (4) and an insulating layer (6) formed on the carrier film; (b) forming via holes (8) in predetermined parts of said insulating sheet by applying a laser light thereto; (c) filling a conductive material (10) in the via holes formed in said insulating sheet; (d) forming a circuit-pattern layer (12) on said insulating layer with the via holes filled with the conductive material; (e) repeating steps (a) to (c) on an uppermost insulating sheet, and repeating steps (a) to (d) until a desired number of circuit-pattern layers are formed below said insulating sheet, in the case where the board has at least two circuit-pattern layers; and (f) firing the layers of the multilayered structure formed in the step (e) at the same time.

17 Claims, 4 Drawing Sheets

METHOD OF MANUFACTURING A MULTILAYERED CIRCUIT BOARD

This is a continuation, of application Ser. No. 07/849,072 filed Apr. 24, 1992, now abandoned.

BACKGROUND OF THE INVENTION

1. Field of the Invention

The present invention relates to a method of manufacturing a multilayered circuit board, by using dielectric composition, and more particularly, to an improved method of forming via holes and vias for connecting the layers constituting a multilayered circuit board.

2. Description of the Prior Art

Generally, a multilayered circuit board comprises conductive layers which are insulated by insulation films formed among them.

Methods of manufacturing multilayered circuit boards are roughly classified into the following two types: Method 1

The method comprises the steps of:

(1) forming via holes in predetermined portions of each insulating sheet made of insulative ceramic, by mechanical means such as a drill or a punch;

(2) filling the via holes with electrically conductive material;

(3) forming a conductor-pattern layer (i.e., an electric circuit) on each insulating sheet, in accordance with positions of the via holes;

(4) using positioning pins, thereby aligning the insulating sheets with the positioning holes or notches already cut therein, and then pressing and forming the insulating sheets together; and (5) firing the multilayered structure, thus pressed and formed, simultaneously. Method 2

This method comprises the steps of:

(1) forming a conductive layer by using polymerbase material for forming thick film, on a substrate made of ceramic dielectric material such as alumina, by means of screen-printing, and firing to remove volatile solvent, and to sinter the solid component;

(2) forming a required number of via holes in predetermined portions of insulating sheet, by mechanical means such as a drill or a punch;

(3) laminating the insulating sheet of the step (2) on, and precisely aligning the insulating sheet with, the substrate made by the step (1), and pressing, and firing the resultant structure;

(4) filling the via holes with conductive paste for forming thick film, by means of screen printing, and firing the conductive paste filled in the via holes;

(5) forming a conductor-pattern layer (i.e., an electric circuit) on the fired insulating sheet in accordance with the registration of the vias, and firing; and (6) repeating the steps (2) to (5), thereby forming a desired number of other conductor-pattern layers.

Methods 1 and 2 have their respective characterizing features, in the way how the components of the circuit board shrink while being fired. Method 1 is to form a multilayered structure comprising a plurality of insulating sheets and a plurality of conductor-pattern layers. When fired, they each are sintered, and they shrink in three dimensions, forming an integral multilayered circuit board (integral-type circuit board). In method 2, a plurality of insulating sheets are laid on the substrate, one upon another. The substrate does not shrink when the whole structure is fired. Only the multilayered structure on the substrate shrinks in the direction of thickness, whereby a multilayered circuit board fixed to a substrate is provided (composite type circuit board).

Methods 1 and 2 have drawbacks which result from their respective characterizing features. Method 1, wherein insulating sheets are laid one upon another, is disadvantageous in the following respects:

a) A jig is required for aligning the insulating sheets, and it is difficult to align the sheets with precision.

b) High-precision process is required to fill the via holes with conductive material, and the yield of the circuit board is low if the circuit formed thereon has a high integration density.

Method 2, wherein the insulating sheet having via holes is laid on a substrate with a conductor-pattern layer on it, and then the sheet and the substrate are fired, is disadvantageous in the following respects:

c) The insulating sheet having via holes must be precisely aligned with the conductor-pattern layer formed on the substrate. This alignment inevitably required a complex and, hence, expensive apparatus, and results in a low yield of the circuit board.

d) The shrinking of the insulating sheet, resulting from the firing, adversely influences the alignment between the sheets.

Moreover, methods 1 and 2 have the following drawback in common:

e) Since each via hole cut in the insulating sheet by the mechanical means has a cylindrical shape, air is likely filled in the hole along with the conductive material. This jeopardizes the electrical connection between the conductor-pattern layers achieved by the via.

Because of the drawbacks mentioned above, the multilayered circuit boards which can be made by either method have some limitations. For example, the circuit boards cannot be sufficiently dense in a Z axis (i.e., in the direction of lamination), or the insulating sheets incorporated in the boards must have a thickness falling within a specific range (e.g., 300 to 600 $\mu$m), so that the sheet can be easily processed.

SUMMARY OF THE INVENTION

It is the object of the present invention to provide a method of manufacturing a multilayered circuit board, wherein sheets may be handled easily, without any need of alignment step for lamination of insulating sheets, and without any need for consideration of any influence on the alignment by the shrinkage of the sheet resulting from fire.

It is another object of the invention to provide a method of manufacturing a high-precision, high-density multilayered circuit board, by means of an apparatus of simple structure, wherein via holes are reliably filled with conductive material to form vias suitable for circuit pattern layers, and their filling step is simplified.

According to the present invention, there is provided a method of a multilayered circuit board by using an insulating sheet containing, as main component, powder of ceramic and/or glass and an organic binder, said method comprising the steps of:

1) laying the insulating sheet onto a substrate, with a carrier film placed on its upper surface;

2) forming via holes in predetermined portions of the insulating sheet and filling the via holes, thereby forming vias therein; and 3) forming on the insulating sheet an electric circuit connected to a lower electric circuit by the vias.

Further, the steps 1), 2) and 3) and the like are repeated a number of times equal to that of desired circuits, thus forming a multilayered structure. The structure is fired, thus forming a multilayered laminated circuit board. The via holes are formed by removing predetermined parts of the insulating sheet laid on the substrate, by applying photo-thermo energy onto these parts of the insulating sheet.

Moreover, in the method of manufacturing a multilayered circuit board, according to the invention, conductive material can easily be filled in the holes formed in the insulating sheet and the carrier film, by means of screen printing, wherein use is made of the carrier film and a secondary mask.

The ceramic, glass, organic polymer binder, all being the materials of the insulting sheet, can be those used hitherto.

As has been described, the present invention provides a method of manufacturing a circuit board comprising a plurality of conductive layers insulated by insulating film interposed between the conductive layers. In this method, the layers need not be aligned in connection with forming via holes therein. Therefore, neither special technology nor special jigs are required to align the layers. Nor is it necessary to pre-process each insulating sheet.

Also, in the method of the present invention, via holes need not be formed in each insulating sheet, at so precise positions as is required in the conventional method in order to compensate the shrinkage of the backed insulating sheet. Hence, the handling efficiency of the insulation sheets is high during the lamination of the sheets.

Moreover, it is possible with the method of the invention to fire the unfired insulating sheets and the conductive layers (i.e., circuit-pattern), all laminated together, in a single step. Hence, the time required to manufacture a multilayered circuit board is shorter than otherwise.

In the invention, via holes are formed in the insulating sheet, by applying photo-thermo energy such as a laser light to the predetermined parts of the sheet. Each via hole, thus formed, has a shape of a truncated cone whose diameter gradually decreases in the direction of applying the laser light. Due to its specific shape, the via hole can be filled the conductive material, without trapping air, thereby forming a via which has a good conductivity.

Further, in the present invention, the energy of the laser light is absorbed into the insulating sheet, achieving a thermal effect, thus forming holes in the sheet. The light is reflected from the metal component of the conductive layer forming the electric circuit located below the insulating sheet. Therefore, the laser light does no damage to the electric circuit, whether or not the conductive layer has been fired.

DETAILED DESCRIPTION OF THE PREFERRED EMBODIMENTS

Methods of manufacturing multilayered circuit boards, according to the present invention, will now described with the accompanying drawings.

The insulating sheet used in the present invention is made of a composition comprising prepared by mixing a binder of polymer and powder of dielectric material such as alumina or glass by means of a ball mill. The polymer is thermally decomposed when the sheet is fired in an oxidizing atmosphere or a non-oxidizing atmosphere after the sheet has been laminated.

EXAMPLE 1

Figure 1A:
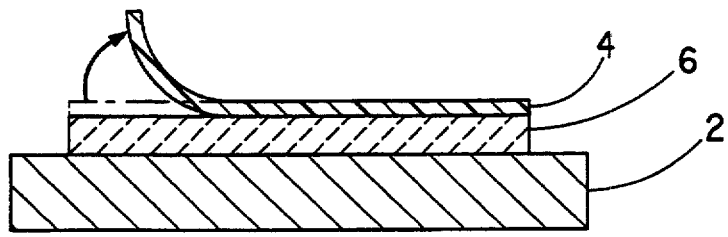
FIGS. 1A to 1D are sectional views, explaining the steps of a method of manufacturing a multilayered circuit board, which is an embodiment of the present invention.

As is shown in FIG. 1A, in the step (a), an insulating sheet 6 coated with a carrier film 4 is laminated to a makeshift substrate 2 made of stainless steel at 70° C. for ten minutes under pressure of 100 kg/cm$^2$. Then, the carrier film 4, which is made of polyester, polypropylene or the like, is peeled from the insulating sheet 6.

The insulating sheet 6, used here, is a sheet having a thickness of about 100 μm and made of by flow-coating a slip composition on a polyester film having a thickness of, for example, 75 μm, and by drying the slip composition. The slip composition has been prepared by ball-milling the following components used in the specific amounts specified below, for a predetermined time.

TABLE 1

| Slip Composition 1 | |
| --- | --- |
| Glass composition | 34 |
| Alumina powder | 17 |
| Quartz silica powder | 4 |
| Acryl-base polymer | 4 |
| Phthalate-base plasticizer | 2 |
| Methyl ethyl ketone | 20 |
| 1,1,1-trichloroethylene | 19 |
| Total | 100 |

The glass composition is made up of the following components:

TABLE 2

| Glass Composition | |
| --- | --- |
| PbO | 17.2% |
| $B_2O_3$ | 4.5% |
| $SiO_2$ | 56.5% |
| $Al_2O_3$ | 9.1% |
| CaO | 8.6% |
| $Na_2O$ | 2.4% |
| $K_2O$ | 1.7% |
| Total | 100.0% |

Figure 1B:
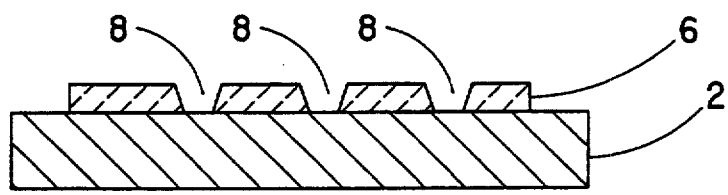

Then, as is shown in FIG. 1B, in the step (b), via holes 8 are made in predetermined parts, by applying a laser light from a 3 W carbonic acid gas laser driven by a pulse having a 0.1 millimeter size. The light is defocussed such that via hole will have a diameter of 180 microns.

Figure 1C:
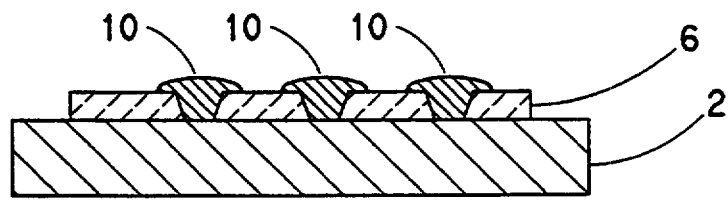

Next, as is shown in FIG. 1C, in the step (c), silver-base conductive material for milling via holes, 6141D manufactured by E.I. Du Pont, is applied into the via holes by means of a thick-film screen-printing machine, through a metal mask which is 50 microns thick and has holes located at the positions corresponding to the via holes and having a diameter of 200 microns. As a result, vias 21 are formed in the via holes. The structure is left to stand at 100° C. for 10 minutes, whereby the vias are dried.

Figure 1D:
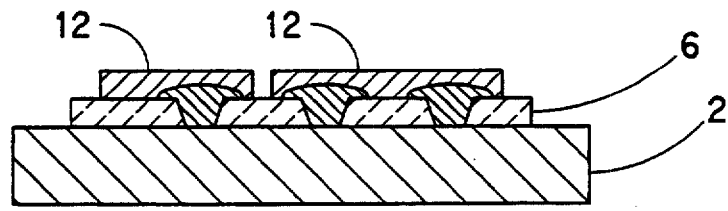

Then, as is shown in FIG. 1D in the step (d), a circuit-pattern layer 12 (i.e., an electric circuit) made of silver-base conductive material for forming internal electric circuits, 6142D manufactured by E. I. Du Pont, on the insulting sheet with the via holes filled with the conductive material, by means of screen-printing. The structure shown in FIG. 1D is left to stand at 100° C. for 10 minutes, and is thereby dried.

Thereafter, the steps (a) to (d) are repeated, thereby forming seven-layered structure, laid one upon the other. Then, the steps (a) to (c) are performed, thereby forming an eight-layered structure. Finally, the makeshift substrate 2 is removed, and the eight-layered structure including the insulating sheets is pressed with pressure of 210 kg/cm² for 10 minutes. The eight-layered structure is mounted on an alumina support, and is then fired under the following conditions:

(1) Raise temperature from 25° C. to 350° C., spending 30 minutes.
(2) Hold the temperature at 350° C. for 60 minutes.
(3) Raise the temperature from 350° C. to 850° C., spending 15 minutes.
(4) Hold the temperature at 850° C. for 15 minutes.
(5) Lower the temperature from 850° C. to 100° C., spending 30 minutes.

The firing is performed within a programmable box furnace, whereby a sintered, multilayered circuit board is obtained which is comprised of eight insulating and seven internal circuit-pattern layers and which has vias formed in both surfaces.

EXAMPLE 2

With reference to FIGS. 2A to 2D, a method of manufacturing a multilayered circuit board will be described with, in which an insulating sheet is laminated on a substrate with a conductor-pattern layer already formed on it, and the structure thus formed is sintered.

Figure 2A:
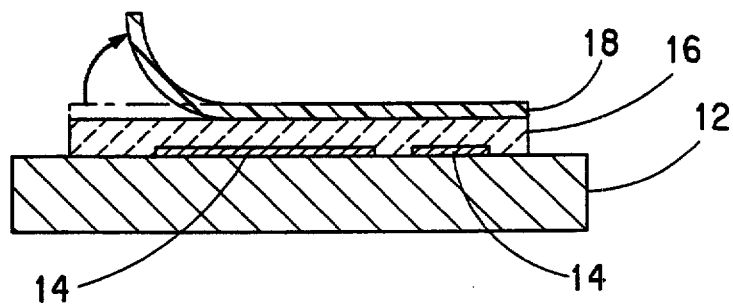
FIGS. 2A to 2D are sectional views, explaining the steps of a method of manufacturing a multilayered circuit board, which is a second embodiment of the present invention.
Figure 2B:
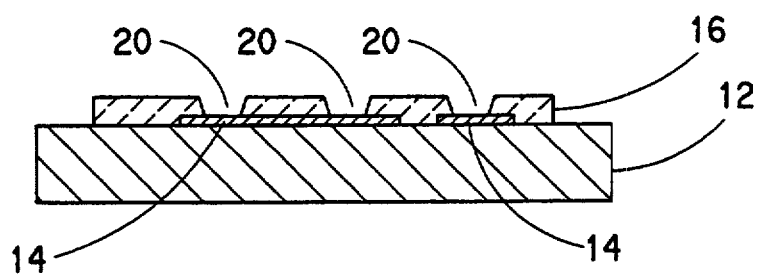

As is shown in FIG. 2A, a conductor-pattern layer 14 made of silver-base conductive material for forming a thick film, 6160 manufactured by E. I. Du Pont, is formed by means of conventional screen printing on a substrate 12 made of 96% alumina and having a thickness of about 0.63 mm. Then, the layer 14 is dried at 150° C. for 10 minutes. Next, an insulating sheet 16 is laminated on the substrate under pressure of 60 kg/cm² at 60° C. for 2 minutes. The sheet 16 has been made by casting a slip composition prepared by ball-milling the components specified in Table 3 used in the specific amounts specified also in Table 3, for a predetermined period of time. As in Example 1, a carrier film 18, which has been coated on the sheet, is peeled from the insulating sheet. Then, as is shown in FIG. 2B via holes 20 are made in the first insulating sheet 16 in the step (b), in the same way as in the step (b) of the example 1 (the method of manufacturing a multilayered circuit board comprising insulating sheets only).

Figure 2C:
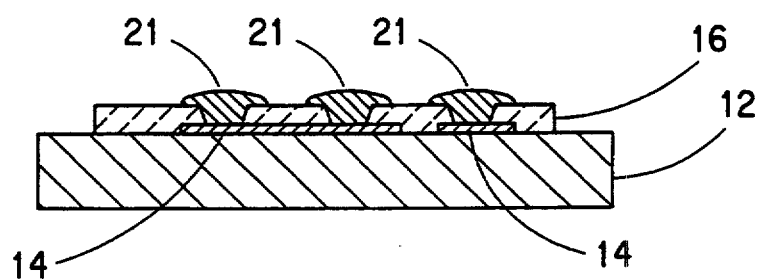

Then, as is shown in FIG. 2C, in the step (c) silver-base conductive material, 6160 manufactured by E. I. Du Pont, is applied into the via holes, thereby forming vias 21, in the same way as in the step (c) which has been described with reference to FIG. 1C.

TABLE 3

| Slip Composition 2 | |
|---|---|
| Glass composition | 29 |
| Alumina powder | 18 |
| Quartz silica powder | 4 |
| Acryl-base polymer | 7 |
| Phthalate-base plasticizer | 8 |
| Methyl ethyl ketone | 17 |
| 1,1,1,-trichloroethylene | 17 |
| Total | 100 |

Figure 2D:
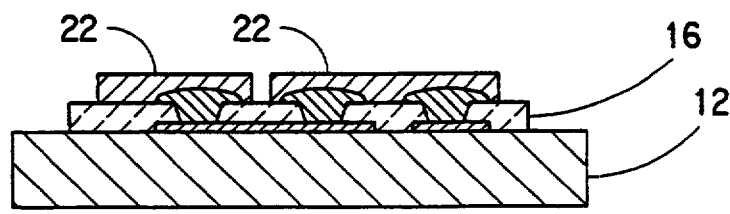

Next, as is shown in FIG. 2D, in the step (d), an electric circuit 22 is printed by using silver-base conductive material, 6160 manufactured by E. I. Du Pont, on the insulting sheet with the via holes filled, in the same way as in the step (d) which has been described with reference to FIG. 1D.

Figure 3A:
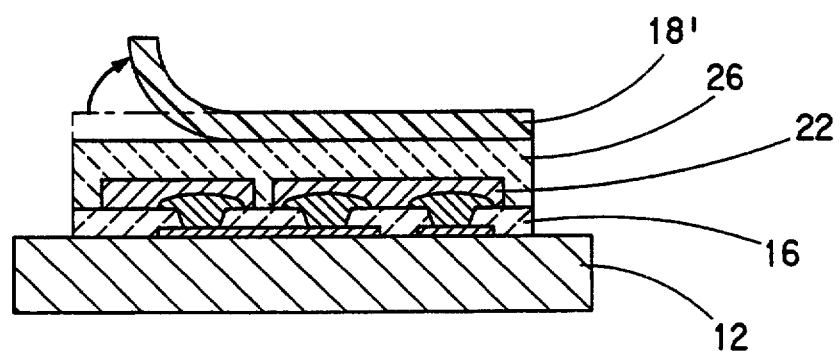
FIGS. 3A and 3B are sectional views, explaining steps of laminating a plurality of insulating sheets in the method of the first embodiment of the invention.
Figure 3B:
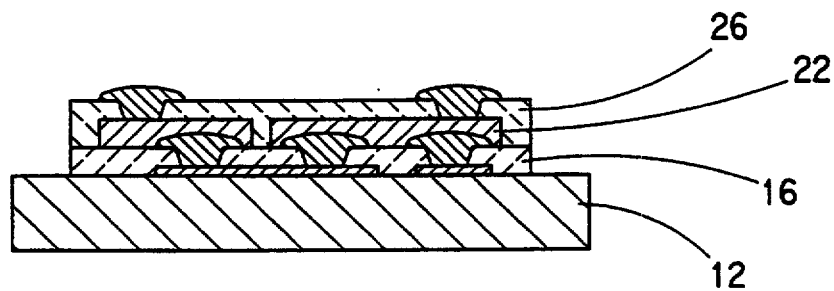

Thereafter, the steps (a) to (d) described above with reference to FIGS. 2A to 2D are performed on a second insulating sheet 26, as is shown in FIG. 3A, thereby forming a circuit board comprising two insulating sheets as is illustrated in FIG. 3B. Finally, the steps (a) to (c) described with reference to FIGS. 2A to 2C are performed, thereby forming a multilayered structure having three insulating sheets on the substrate. The multilayered structure is fired, together with the substrate, under the following conditions:

(1) Heat 850° C. to 860° C., for 10 minutes.
(2) Heat at 800° C. or more for 20 minutes.
(3) Heat at 600° C. or more for 30 minutes.
(4) Heat at 100° C. or more for 60 minutes.

The firing is performed by means of a conveyer firing furnace commonly used to form thick films. The product of the firing is a sintered multilayered structure comprising one alumina substrate, three insulating sheets, three internal circuit-pattern layers, and vias formed in firm contact with the insulating layer.

Finally, a circuit-pattern layer made of palladium-silver conductive material for forming thick film, i.e., 6134 manufactured by E. I. Du Pont, is formed on the insulating sheet of the multilayered structure. As a result, a multilayered circuit board having four circuit-pattern layers is obtained.

Thereafter, the board is put to electrical tests, to determine whether or not each of the four circuit-pattern layers includes disconnection or short-circuited parts.

This embodiment has an insulating sheet laminated on the circuit-pattern layer formed on only one surface of a substrate. Instead, two insulating sheets can be laminated on the circuit-pattern layers formed on both surfaces of the substrate, in which case the substrate must have through holes so that the circuit-pattern layers can be electrically connected. Such a multi-layered circuit board, with the substrate sandwiched between the insulating layers, is manufactured by performing the same steps as in the examples described above.

In the example described above, the steps (a) to (d) are performed on each insulating sheet, or the steps (a) to (c) are performed on the uppermost insulating sheet, and then the resultant structure is fired.

Nevertheless, it is possible that the steps (a) and (b) are performed on each insulating sheet, the resultant structure is fired, and thereafter the step (c) et. seq. are performed.

In the present invention, the conductive material filling the via holes and forming the circuit-pattern layers is basically one prepared for forming thick films.

The material is a commonly used silver alloy for forming thick film, such as a silver-base one and the like, a silver-palladium one, or a silver-platinum one. Alternatively, it can be a gold-base one or a copper-base one, either used for forming thick films.

However, in Example 1, a multilayered structure comprising several insulating sheets is formed on the makeshift substrate, the makeshift substrate is removed from the multilayered structure, and the multilayered structure is fired. When fired, the multilayered structure shrinks in the directions of its thickness and the plane, i.e., all three dimensions. Hence, The conductive material filled in the via holes and forming the circuit-pattern layers must be one which matches with the shrinking of the multilayered structure, so that the structure does not warp, crack, or delaminate.

Also in Example 2, a multilayered structure comprising several insulating sheets formed on a substrate is fired together with the substrate. Hence, it shrinks only in the direction of its thickness, not in the plane Therefore, the conductive material filled in the via holes and forming the circuit-pattern layers must therefore be one which can match with the shrinking of the multilayered structure.

The substrate used in Example 1, is used temporarily during laminating, and is ultimately removed. Therefore, it can be made of any material that can reflect the photo-thermo energy and is sufficiently heat-resistant. It can be a metal plate. The substrate used in Example 2, however, is fired along with the multilayered structure of insulating sheets, and is a part of the circuit. In view of this, the substrate should better be made of one of those materials for forming thick films. More specifically, the substrate can be made of a variety of materials, such as one of aluminas of various grades (e.g., 90%-alumina, 96%-alumina, or 99%-alumina); ceramic such as aluminum nitride or silicon carbide; iron-based metal such as stainless steel or Inconel; or a metal plywood consisting of copper-Invar-copper, or copper-molybdenum-copper.

A carbonic acid gas laser or a semiconductor laser such as YAG, which emits infrared rays, is generally used as the source of the photo-thermo energy for forming via holes. Alternatively, various flash light-sources which emit infrared rays can be used as well. When a laser light is used, via holes of a sufficiently good shape can be formed without the use of a light-transmitting mask, merely by controlling the focal point of the light since the laser light is coherent.

As a method of performing positioning in order to form via holes in the sheet at desired positions, one via hole is first made in the sheet by applying one or more laser pulses, then a table is positioned by means of a fixed head. Alternatively, a laser light is radiated through a mirror and applied to the sheet, so that the light can easily be applied to any desired part of the sheet by changing the inclination of the mirror.

The positional relationship between the focal point and each insulating sheet is not limited. It is desirable that the focal point be set within or above the insulting sheet, thereby to minimize the thermal damage to the conductive layer located below.

When flash light (a laser light not focused) is applied, use is made of a mask, such as a metal mask having holes cut at the positions corresponding to the via holes which are to be formed. The photo-thermo energy passes through the holes of the mask to form via holes in the corresponding parts of the insulating sheet on the lower surface of the mask. Although this method cannot use energy with high efficiency, it is advantageous in that a number of via holes can be formed by applying flash light to the sheet only once.

In both cases, the energy required to form one via hole in each insulating sheet is far less than the energy needed to scribe a ceramic substrate, such as an alumina substrate, to cut a via hole therein.

The principle of forming via holes by applying photo-thermo energy, such as a laser light, will now be explained. When photo-thermo energy, particularly thermo energy, is applied to the predetermined parts of an insulating sheet, the organic binder contained in these parts of the sheet explosively burns. The binder spreads in the form of a gas or fine particles. Although some inorganic substance seems to gasified or changed into fine particles, simultaneously, it is the organic binder that effectively contribute to the forming of via holes. Hence, via holes can be formed with a relatively small amount of energy.

As may be easily assumed from the above, the surface of the sheet remains clean, and the clean surface of the sheet is exposed by peeling off the carrier film, if light is applied to the sheet through the carrier film such as polyester film, rather than directly to the insulating sheet, because if the light is applied to the sheet through the carrier film, the spreading organic and inorganic fine particles stick onto the carrier sheets, not onto the the surface of the insulating sheet.

Further, it is easy to vacuum-clean or wipe the carrier film to make the film clean also when the insulating sheet having via holes is used as a mask in the process of filling the via holes.

The via holes have a diameter ranging from about 20 to about 700 microns in most cases. The most common diameter is about 50 microns to about 400 microns. According to the invention, via holes having a diameter of about 50 microns to about 400 microns are most easy to form by applying photo-thermo energy to the insulating sheet. This range of diameter is identical to the value most common in practice.

EXAMPLE 3

Figure 4A:
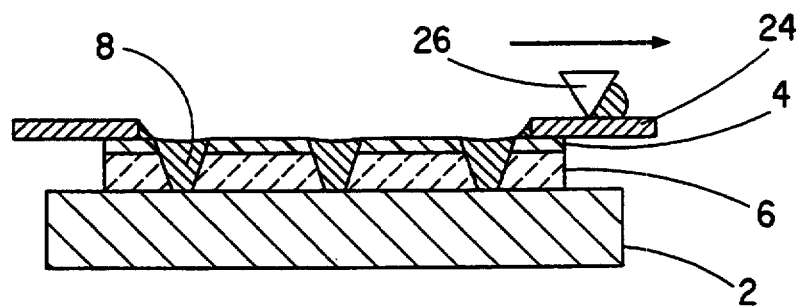
FIGS. 4A and 4B are sectional views, explaining steps of filling the via holes of each insulating sheet with conductive material in steps of manufacturing a multilayered circuit board, which is a third embodiment of the invention.
Figure 4B:
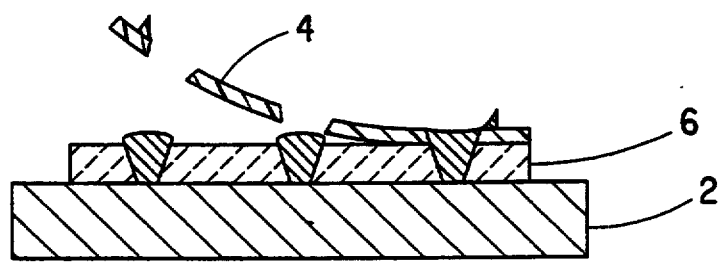

Another example of a method of manufacturing a multilayered circuit board, according to the present invention is to fill a conductive material in the via holes made in a carrier film 4 and an insulating sheet 6 by means of screen printing, by using the carrier film and a secondary mask, as is illustrated in FIGS. 4A and 4B.

In this method, via holes are formed in an insulating sheet 6 by performing the steps (a) and (b) as is described with reference to FIGS. 1A and 1B to manufacture an integral-type circuit board, and by performing the steps (a) and (b) as is described with reference to FIGS. 2A and 2B to manufacture a composite-type circuit board.

At this time, a carrier film 4 has holes aligned with the via holes 8 made in the insulating sheet 6. The film 4 is used as primary mask. Used as secondary mask is a metal mask 24 which is 50 μm thick and has a hole having a diameter of 2 mm and being concentric with the center via hole. The mask 24 is roughly aligned, and a conductive material, i.e., 6141D or 6160 manufactured by E. I. Du Pont, is filled in the via holes by screen printing, as is illustrated in FIG. 4A. The structure is dried at 100° C. for 5 minutes. Then, as is shown in FIG. 4B, the carrier film 4 is peeled off from the structure. Further, the step in the examples described above is performed, thereby forming an electric circuit on the insulating sheet having the via holes now filled with the conductive material. As a result, either an integral-type circuit board or a composite-type circuit board can be manufactured. The circuit board, thus manufactured, perform the same electrical function as those made in the examples described above.

The use of the carrier film and the secondary mask in filling the via holes facilitates the aligning very much, and helps to achieve the filling of via holes with no mis-alignment.

What is claimed is:

1. A method of manufacturing a multilayered circuit board comprising the steps of:
    (a) laminating an insulating sheet on a lower layer which reflects a laser light applied through the insulating sheet, said insulating sheet comprising an upper carrier film and an insulating layer formed on the carrier film and said insulating layer containing, as main components, ceramic and/or glass powder and an organic polymer binder;
    (b) forming via holes in predetermined parts of said insulating sheet by applying a laser light thereto;
    (c) filling a conductive material in the via holes formed in said insulating sheet through a screen-printing mask consisting of said carrier film and a secondary mask;
    (d) peeling said carrier film from said insulating layer;
    (e) forming a circuit-pattern layer on said insulating layer with the via holes filled with the conductive material;
    (f) in the event the multilayered circuit board requires more than one circuit-pattern layer, repeating the sequence of steps (1) through (5) until the desired number of circuit layers has been obtained:
        (1) laminating an insulating sheet on the uppermost circuit-pattern layer and exposed areas of the uppermost insulating layer, said insulating sheet comprising an upper carrier film and an insulating layer formed on the carrier film and said insulating layer containing, as main components ceramic and/or glass powder and an organic polymer binder;
        (2) forming via holes in predetermined parts of said insulating sheet by applying a laser light thereto;
        (3) filling a conductive material in the via holes formed in said insulating sheet through a screen printing mask consisting of said carrier film and a secondary mask;
        (4) peeling said carrier film from said insulating layer;
        (5) forming a circuit-pattern layer on said insulating layer with the via holes filled with the conductive material;
    (g) laminating an insulating sheet on the uppermost circuit-pattern layer and exposed areas of the uppermost insulating layer, said insulating sheet comprising an upper carrier film and an insulating layer formed on the carrier film and said insulating layer containing, as main components, ceramic and/or glass powder and an organic polymer binder;
    (h) repeating steps (b) through (d) on the outermost laminated insulating sheet; and
    (i) firing the laminated structure of step (h).

2. A method of manufacturing a multilayered circuit board comprising the steps of:
    (a) laminating an insulating sheet on a lower layer which reflects a laser light applied through the insulating sheet, said insulating sheet comprising an upper carrier film and an insulating layer formed on the carrier film and said insulating layer containing, as main components, ceramic and/or glass powder and an organic polymer binder;
    (b) forming via holes in predetermined parts of said insulating sheet by applying a laser light thereto;
    (c) filling a conductive material in the via holes formed in said insulating sheet;
    (d) peeling said carrier film from said insulating layer;
    (e) forming a circuit-pattern layer on said insulating layer with the via holes filled with the conductive material;
    (f) in the event the multilayered circuit board requires more than one circuit-pattern layer, repeating the sequence of steps (1) through (5) until the desired number of circuit layers has been obtained:
        (1) laminating an insulating sheet on the uppermost circuit-pattern layer and exposed areas of the uppermost insulating layer, said insulating sheet comprising an upper carrier film and an insulating layer formed on the carrier film and said insulating layer containing, as main components ceramic and/or glass powder and an organic polymer binder;
        (2) forming via holes in predetermined parts of said insulating sheet by applying a laser light thereto;
        (3) filling a conductive material in the via holes formed in said insulating sheet;
        (4) peeling said carrier film from said insulating layer;
        (5) forming a circuit-pattern layer on said insulating layer with the via holes filled with the conductive material;
    (g) laminating an insulating sheet on the uppermost circuit-pattern layer and exposed areas of the uppermost insulating layer, said insulating sheet comprising an upper carrier film and an insulating layer formed on the carrier film and said insulating layer containing, as main components, ceramic and/or glass powder and an organic polymer binder;
    (h) repeating steps (b) through (d) on the outermost laminated insulating sheet; and
    (i) firing the laminated structure of step (h).

3. The method according to claim 2, further comprising the step of firing said insulating layer with via holes formed therein, after step (b) and before step (c).

4. The method according to claim 1, wherein said lower layer in step (a) is selected from the group consisting of a substrate made of a material to be fired along with said laminated structure of insulating layer, and a substrate to be removed from said laminated structure of the insulating layer before the step of firing.

5. The method according to claim 4, wherein said lower in step (a) comprises a substrate having a circuit-pattern layer and made of a material to be fired along with said laminated structure of the insulating layer.

6. The method according to claim 4 wherein the lower layer is a substrate to be removed, further comprising the step of separating and removing the lower layer from said laminated structure of the insulating layers, before firing the laminated structure.

7. The method according to claim 1, wherein said laser light in step(b) is an infrared laser light.

8. The method according to claim 7, wherein, in step (b), via holes are formed in said insulating sheet after positioning said insulating sheet off the focal point of a laser light.

9. The method according to claim 1, wherein flashlight exposure is performed in step (b).

10. The method according to claim 1, further comprising the steps of:
   (j) forming a circuit-pattern layer on the outermost insulating layer and filled via surface of the fired structure from step (i); and
   (k) firing the structure of step (j).

11. The method according to claim 5, wherein said lower layer in the step (a) is a substrate having a circuit-pattern layer formed on both surfaces of said substrate and electrically connected to each other by means of holes through the substrate, and steps (a) through (i) are carried out on both surfaces of the lower layer.

12. The method according to claim 2, wherein said lower layer in step (a) is selected from the group consisting of a substrate made of a material to be fired along with said laminated structure of insulating layer, and a substrate to be removed from said laminated structure of the insulating layer before the step of firing.

13. The method according to claim 2, wherein said laser light used in step(b) is an infrared laser light.

14. The method according to claim 2, wherein flashlight exposure is performed in step (b).

15. The method according to claim 2 further comprising the steps of:
   (j) forming a circuit-pattern layer on the outermost insulating layer and filled via surface of the fired structure from step (i); and
   (k) firing the structure of step (j).

16. The method according to claim 5 further comprising the steps of:
   (j) forming a circuit-pattern layer on the outermost insulating layer and filled via surface of the fired structure from step (i); and
   (k) firing the structure of step (j).

17. The method according to claim 6 further comprising the steps of:
   (j) forming a circuit-pattern layer on the outermost insulating layer and filled via surface of the fired structure from step (i); and
   (k) firing the structure of step (j).

* * * * *